(12) United States Patent
Hwang et al.

(10) Patent No.: US 9,190,577 B2
(45) Date of Patent: Nov. 17, 2015

(54) LIGHT EMITTING DEVICE WITH ENCAPSULANT FORMED WITH BARRIERS AND LIGHT EMITTING DEVICE PACKAGE HAVING THE SAME

(71) Applicant: LG INNOTEK CO., LTD., Seoul (KR)

(72) Inventors: Jung Ha Hwang, Gunpo-si (KR); Kyoung Woo Jo, Gunpo-si (KR)

(73) Assignee: LG INNOTEK CO., LTD., Seoul (KR)

( * ) Notice: Subject to any disclaimer, the term of this patent is extended or adjusted under 35 U.S.C. 154(b) by 84 days.

(21) Appl. No.: 13/858,712

(22) Filed: Apr. 8, 2013

(65) Prior Publication Data

US 2013/0234188 A1 Sep. 12, 2013

Related U.S. Application Data

(63) Continuation of application No. 12/909,438, filed on Oct. 21, 2010, now Pat. No. 8,415,698.

(30) Foreign Application Priority Data

Oct. 22, 2009 (KR) ........................ 10-2009-0100654

(51) Int. Cl.
*H01L 33/00* (2010.01)
*H01L 33/50* (2010.01)
*H01L 33/54* (2010.01)

(52) U.S. Cl.
CPC .............. *H01L 33/50* (2013.01); *H01L 33/54* (2013.01); *H01L 33/508* (2013.01); *H01L 2924/0002* (2013.01)

(58) Field of Classification Search
None
See application file for complete search history.

(56) References Cited

U.S. PATENT DOCUMENTS

| 5,133,811 | A | 7/1992 | Kirkwood et al. | |
|---|---|---|---|---|
| 7,566,912 | B2 | 7/2009 | Lee et al. | |
| 7,902,564 | B2 * | 3/2011 | Mueller-Mach et al. | 257/98 |
| 2003/0141506 | A1 * | 7/2003 | Sano et al. | 257/78 |
| 2003/0146445 | A1 | 8/2003 | Hen | |
| 2006/0243995 | A1 | 11/2006 | Hong et al. | |
| 2007/0284601 | A1 | 12/2007 | Khanarian | |
| 2008/0149956 | A1 | 6/2008 | Mueller-Mach et al. | |
| 2008/0150416 | A1 | 6/2008 | Maruyama et al. | |
| 2008/0191224 | A1 | 8/2008 | Emerson et al. | |
| 2008/0254393 | A1 | 10/2008 | Chao et al. | |
| 2009/0002810 | A1 | 1/2009 | Jeon et al. | |
| 2009/0014731 | A1 | 1/2009 | Andrews et al. | |
| 2009/0014736 | A1 | 1/2009 | Ibbetson et al. | |
| 2009/0057690 | A1 | 3/2009 | Chakraborty | |
| 2009/0309114 | A1 | 12/2009 | Lu et al. | |
| 2010/0038670 | A1 | 2/2010 | Panaccione et al. | |
| 2010/0084675 | A1 * | 4/2010 | Ueno et al. | 257/98 |

FOREIGN PATENT DOCUMENTS

| EP | 1 467 600 A1 | 10/2004 |
|---|---|---|
| JP | 2004-363343 A | 12/2004 |
| JP | 2008-135539 A | 6/2008 |
| KR | 10-2004-0070230 A | 8/2004 |
| KR | 10-2006-0021473 A | 3/2006 |
| KR | 10-2007-0093551 A | 9/2007 |
| KR | 10-0845864 B1 | 7/2008 |
| KR | 10-2009-0006790 A | 1/2009 |

* cited by examiner

*Primary Examiner* — Michael Jung
(74) *Attorney, Agent, or Firm* — Birch, Stewart, Kolasch & Birch, LLP

(57) ABSTRACT

Provided are a light emitting device, a light emitting device package, and a lighting system. The light emitting device (LED) comprises an LED chip, a barrier over the LED chip, and an encapsulating material containing a phosphor, wherein the encapsulating material is disposed inside the barrier over the LED chip.

19 Claims, 7 Drawing Sheets

LIGHT EMITTING DEVICE WITH ENCAPSULANT FORMED WITH BARRIERS AND LIGHT EMITTING DEVICE PACKAGE HAVING THE SAME

CROSS-REFERENCE TO RELATED APPLICATIONS

The present application is a 37 C.F.R. §1.53(b) continuation of U.S. patent application Ser. No. 12/909,438 filed Oct. 21, 2010, which claims priority on Korean Patent Application No. 10-2009-0100654, filed Oct. 22, 2009, the entire contents of all which are hereby incorporated by reference and for which priority is claimed under 35 U.S.C. §120.

BACKGROUND

Embodiments relate to a light emitting device, a light emitting device package, and a lighting system.

A light emitting device (LED) may be implemented by combining a p-n junction diode, which has a characteristic converting an electrical energy to a light energy, with Group III and V elements of a Periodic Table. The LED may implement various colors by adjusting a composition ratio of a compound semiconductor.

Three LEDs (i.e., red LED, green LED, and blue LED) that respectively emit light having red, green, and blue colors (three primary colors) may be combined with each other, a yellow phosphor (using phosphors such as yttrium aluminum garnet (YAG) and terbium aluminum garnet (TAG)) may be added to the blue LED, or three-colored (red/green/blue) phosphors may be applied to an UV LED to realize a white LED package.

However, in a related art white LED package using a phosphor, the phosphor within an encapsulating material may be precipitated on a bottom of the LED package as time passed after molding. Thus, there is a limitation that the phosphor is non-uniformly distributed around the LED chip to wide a distribution of a color temperature.

Also, according to a related art, the phosphor may have a distribution area relatively greater than an area of an LED. Thus, there is a limitation that the phosphor is non-uniformly distributed around the LED to wide the distribution of the color temperature.

SUMMARY

Embodiments provide a light emitting device in which a phosphor is uniformly distributed therearound, a light emitting device package, and a lighting system.

In one embodiment, a light emitting device (LED) comprises: an LED chip; a barrier over the LED chip; and an encapsulating material containing a phosphor, wherein the encapsulating material is disposed inside the barrier over the LED chip.

In another embodiment, an LED package comprises: a submount; an LED chip over the submount; a barrier over the LED chip; and an encapsulating material containing a phosphor, wherein the encapsulating material is disposed inside the barrier over the LED chip.

The details of one or more embodiments are set forth in the accompanying drawings and the description below. Other features will be apparent from the description and drawings, and from the claims.

BRIEF DESCRIPTION OF THE DRAWINGS

FIGS. 3 to 6A are sectional views for explaining a method of manufacturing the LED package according to the first embodiment.

DETAILED DESCRIPTION OF THE EMBODIMENTS

Hereinafter, a light emitting device (LED), an LED package, and a lighting system will be described in detail with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Embodiment

Figure 1:
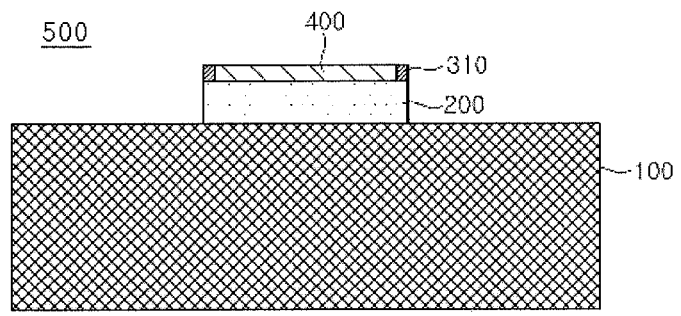
FIG. 1 is a sectional view of a light emitting device (LED) package according to a first embodiment.
Figure 2:
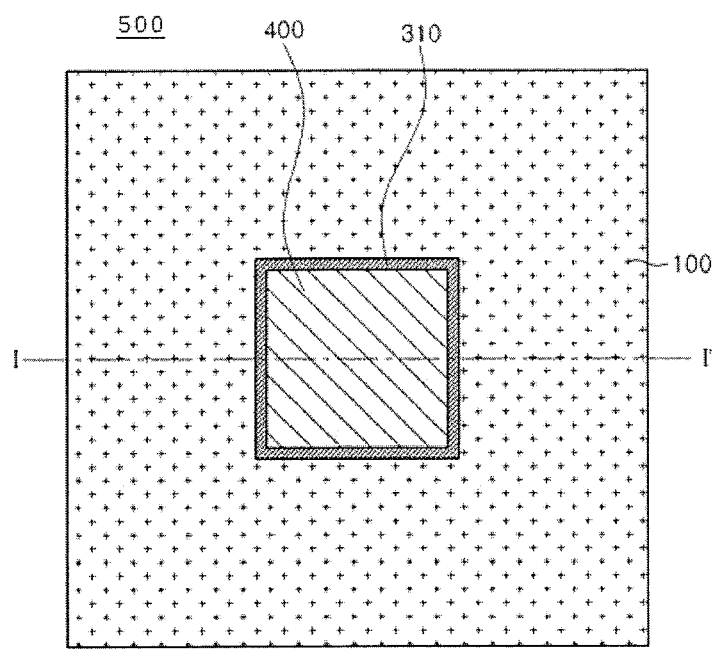
FIG. 2 is a plan view of the LED package according to the first embodiment.

FIG. 1 is a sectional view of a light emitting device (LED) package according to a first embodiment, and FIG. 2 is a plan view of the LED package according to the first embodiment. FIG. 1 is a sectional view taken along line I-I' of FIG. 2.

An LED package 500 according to an embodiment may include a submount 100, an LED chip 200 disposed on the submount 100, a barrier 310 disposed on the LED chip 200, and an encapsulating material 400 containing a phosphor on the LED chip 200.

The barrier 310 may be disposed on an outer top surface of the LED chip 200. For example, the barrier 310 may include a barrier connected to an outer circumference of the LED chip 200, but is not limited thereto.

The encapsulating material 400 may have a flat top surface, but is not limited thereto. When the encapsulating material 400 has the flat top surface, an optical design may be easy through surface emission.

Since the encapsulating material 400 has the flat top surface and a roughness (not shown) is disposed on an upper surface of the encapsulating material 400, external light extraction efficiency may be improved.

According to the LED and LED package of the embodiment, the barrier 310 may be disposed around the LED to uniformly distribute the phosphor around the LED. Thus, the density of the phosphor may be increased to narrow a distribution of a color temperature of the LED.

Hereinafter, a method of manufacturing the LED package according to the first embodiment will be described with reference to FIGS. 3 to 6A. Although the LED package is mainly described below, the embodiment is not limited thereto. As shown FIG. 6D, a barrier and a phosphor layer may be formed on the LED chip in a chip level.

Figure 3:
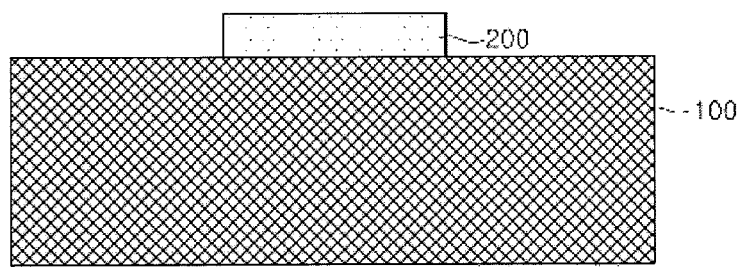

First, as shown in FIG. 3, the submount 100 is prepared.

The submount 100 has a thermal expansion coefficient similar to that of a material of the LED chip. Also, the submount 100 may be formed of a material having superior thermal conductivity. For example, according to the present embodiment, the submount 100 may be formed of a silicon material, a synthetic resin material, or a metallic material, but is not limited thereto.

Also, the submount 100 may include a reflector cup (not shown). In addition, a device having a Zener diode shape may be disposed in the submount 100 to prevent an electro static discharge from occurring.

Next, an LED chip 200 is attached to the submount 100.

The LED chip 200 may be formed of GaN, GaAs, GaAsP, or GaP. For example, green-blue LEDs may be formed of GaN(InGaN) and yellow-red LEDs may be formed of InGaAIP, or AIGaAs, but are not limited thereto.

Figure 4:
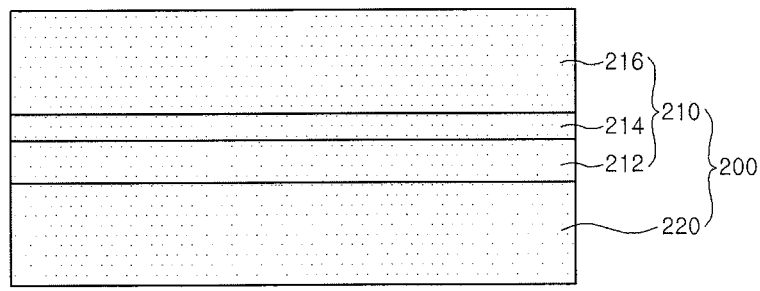

The LED chip 200 illustrated in FIG. 4 may be a vertical type LED chip, but is not limited thereto.

Referring to FIG. 4, the LED chip 200 may include a light emitting structure 210 formed on a second electrode 220. The second electrode layer 200 may include at least one of an ohmic layer, a reflection layer, a junction layer, and a conductive supporting substrate. The light emitting structure 210 may include a second conductive type semiconductor layer 212, an active layer 214, and a first conductive type semiconductor layer 216.

The first conductive type semiconductor layer 212 may be formed of a III-V compound semiconductor in which a first conductive type dopant is doped. In case where the first conductive type semiconductor layer 212 is an N-type semiconductor layer, the first conductive type dopant may include Si, Ge, Sn, Se, or Te as the N-type dopant, but is not limited thereto.

The first conductive type semiconductor layer 212 may be formed of a semiconductor material having a compositional formula of $In_xAl_yGa_{1-x-y}N$ ($0 \leq x \leq 1$, $0 \leq y \leq 1$, $0 \leq x+y \leq 1$).

The first conductive type semiconductor layer 212 may be formed of at least one of GaN, InN, AlN, InGaN, AlGaN, InAlGaN, AlInN, AlGaAs, InGaAs, AlInGaAs, GaP, AlGaP, InGaP, AlInGaP, and InP.

The active layer 214 may have at least one of a single quantum well structure, a multi quantum well (MQW) structure, a quantum-wire structure, and a quantum dot structure. For example, the active layer 214 may have the MQW structure formed by injecting trimethyl gallium (TMGa) gas, ammonia ($NH_3$) gas, nitrogen ($N_2$) gas, and trimethyl indium (TMIn) gas, but is not limited thereto.

A well layer/barrier layer of the active layer 214 may be have at least one pair structure of InGaN/GaN, InGaN/InGaN, AlGaN/GaN, InAlGaN/GaN, GaAs(InGaAs)/AlGaAs, GaP(InGaP)/AlGaP, but is not limited thereto. The well layer may be formed of a material having a band gap lower than that of the barrier layer.

A conductive clad layer may be formed over or/and below the active layer 214. The conductive clad layer may be formed of an AlGaN-based semiconductor and may have a band gap higher than that of the active layer 214.

The second conductive type semiconductor layer 216 may be formed of a III-V compound semiconductor in which a second conductive type dopant is doped, for example, a semiconductor material having a compositional formula of $In_xAl_yGa_{1-x-y}N$ ($0 \leq x \leq 1$, $0 \leq y \leq 1$, $0 \leq x+1$). The second conductive type semiconductor layer 216 may be formed of at least one of GaN, AlN, AlGaN, InGaN, InN, InAlGaN, AlInN, AlGaAs, GaP, GaAs, GaAsP, and AlGaInP. In case where the second conductive type semiconductor layer 216 is a P-type semiconductor layer, the second conductive type dopant may include Mg, Zn, Ca, Sr, Ba, or the like as a P-type dopant. The second conductive type semiconductor layer 216 may be formed in a single- or multi-layer structure, but is not limited thereto.

In the present embodiment, the first conductive type semiconductor layer 212 may be implemented by an N-type semiconductor layer and the second conductive type semiconductor layer 116 may be implemented by a P-type semiconductor layer and vice versa. Also, a semiconductor layer having a polarity opposite to that of the second conductive type, e.g., an N-type semiconductor layer (not shown) may be formed over the second semiconductor layer 216. As a result, the light emitting structure 210 may have at least one of an N-P junction structure, a P-N junction structure, an N-P-N junction structure, and a PN-P junction structure.

For example, the second electrode layer 220 may include the ohmic layer (not shown), and the ohmic layer may ohmic-contact the light emitting structure 210 to smoothly supply a power to the light emitting structure 210. Also, the ohmic layer may be formed by multi-stacking a single metal layer or a metal alloy layer and a metal oxide layer.

For example, the ohmic layer may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but is not limited thereto.

Also, the second electrode layer 220 may include the reflection layer (not shown) to reflect light incident from the light emitting structure 210, thereby improving light extraction efficiency.

For example, the reflection layer may be formed of a metal or alloy including at least one of Ag, Ni, Al, Rh, Pd, Ir, Ru, Mg, Zn, Pt, Au, and Hf. Also, the reflection layer may be formed in a multi-layer structure using the foregoing metal or alloy and a transparent conductive material such as IZO, IZTO, IAZO, IGZO, IGTO, AZO, ATO, etc., for example, may be stacked with IZO/Ni, AZO/Ag, IZO/Ag/Ni, AZO/Ag/Ni, or the like.

Also, in case where the second electrode layer 220 may include the junction layer, the reflection layer may function as the junction layer, or may include a barrier metal or bonding metal. For example, the junction layer may be formed of at least one of Ti, Au, Sn, Ni, Cr, Ga, In, Bi, Cu, Ag, and Ta.

Also, the second electrode layer 120 may include the conductive supporting substrate. The conductive supporting substrate may support the light emitting structure 210 and supply a power to the light emitting structure 210. The conductive supporting substrate may be formed of a metal, a metal alloy or a conductive semiconductor material that have superior conductivity.

For example, the conductive supporting substrate may be formed of at least one of copper (Cu), Cu alloy, gold (Au), nickel (Ni), molybdenum (Mo), Cu—W, a carrier wafer (e.g., Si, Ge, GaAs, GaN, ZnO, SiGe, SiC, $Ga_2O_3$, etc.).

Next, the LED chip 200 may be attached to the submount 100 through a flip chip method, a method in which the LED chip is attached using a polymer adhesive, or a plated eutectic metal.

For example, the LED chip may be attached through a soldering process using an Ag conductive epoxy having superior processability or a eutectic bonding process in case where highly thermal conductivity is required, but is not limited thereto.

Figure 5:
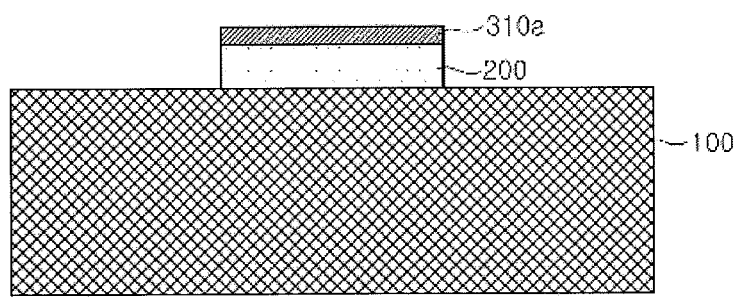

Referring to FIG. 5, a barrier material 310a is formed on the LED chip 200. The barrier material 310a may be formed of a non-conductive material or a conductive material. For example, the non-conductive material may include a photoresist (PR) material, an oxide layer, and a nitride layer, but is not limited thereto.

In case where the barrier material 310a is formed of the conductive material, the barrier may be configured to prevent the LED chip from being short-circuited.

Figure 6A:
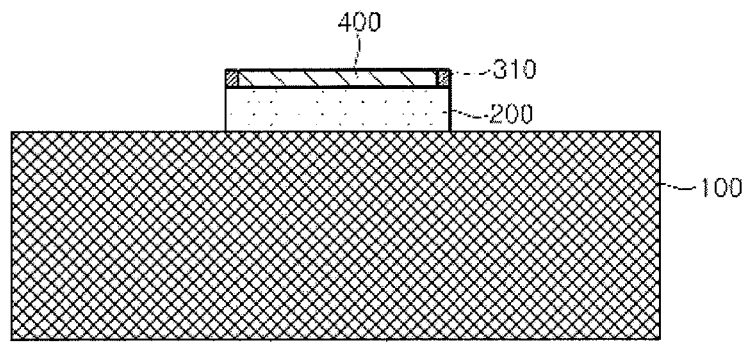

Referring to FIG. 6A, a portion of the barrier material 310a is removed to form a barrier 310 on an outer top surface of the LED chip 200. For example, when the barrier material 310a is a photoresist layer, exposure and developing processes may be performed to form the barrier 310. Also, when the barrier material 310a is formed of an insulating material, an etch process may be performed to form the barrier 310.

In the present embodiment, the barrier 310 may be formed using a thixotropic material without performing the removal process. For example, the barrier 310 may be formed on the outer top surface of the LED chip 200 using Ag epoxy having thixotropy by which the epoxy does not run down to maintain its form.

The barrier 310 may be connected to an outer circumference of the LED chip, but is not limited thereto.

According to the LED and the LED package, the barrier may be formed around the LED, and then an encapsulating material containing a phosphor may be encapsulated adjacent to the LED chip in a next process. Thus, the phosphor may be uniformly distributed around the LED chip.

Alternatively, a wire junction process except for the flip chip process may be performed to allow current to flow into the LED chip. For example, the wire junction process may be performed once in case of the vertical type LED chip. Also, in case of a lateral type LED chip, the wire junction process may be performed two times. The wire may include at least one of an Ag wire, a copper wire, and an aluminum wire. The wire junction process may be performed through a ball wire junction process or an edge wire junction process.

Next, the encapsulating material 400 containing the phosphor (not shown) is encapsulated on the LED chip 200 to protect the chip and improve light extraction efficiency.

The encapsulating material 400 may include an epoxy encapsulating material or a silicon encapsulating material, but is not limited thereto.

In the present embodiment, the LED chip may be an LED, which emits visible light such as green-blue or yellow-red LEDs or an UV LED. Here, the phosphor may be added to the encapsulating material 400 emit white light.

For example, in the present embodiment, a yellow phosphor (using a phosphor such as YAG or TAG) may be added to a blue LED to emit the white light. Alternatively, three-colored (red/green/blue) phosphors may be applied to an UV LED to emit the white light. However, the present disclosure is not limited thereto.

The phosphor may contain a host material and an active material. For example, a cerium active material may be applied to a host material such as yttrium aluminum garnet (YAG), or a europium (Eu) active material may be applied to a silicate-based host material, but is not limited thereto.

The encapsulating process may be performed in order of a combining process, a mixing process, a discharging process, and a curing process. A method of encapsulating the encapsulating material 400 may include a dispensing method, a casting molding method, a transfer molding method, and a vacuum printing method.

The encapsulating material 400 may have a flat top surface, but is not limited thereto. Since the encapsulating material 400 is uniformly formed on the LED chip 200 in a flat shape, the phosphor may be uniformly distributed around the LED chip 200, and also an optical design may be easy through surface emission.

In the present embodiment, a roughness (not shown) may be formed on a top surface of the encapsulating material 400 to improve the light extraction efficiency. For example, a wet etching process may be partially performed after the encapsulating process is performed to partially form the roughness on the top surface of the encapsulating material 400. Alternatively, the transfer molding process may be performed using a mold on which a roughness is formed to form the roughness on the top surface of the encapsulating material 400.

Thereafter, an external lens (not shown) having a hemisphere shape may be formed on the encapsulating material 400 to improve the light extraction efficiency and protect the wire (not shown).

According to the LED and the LED package of the present embodiment, the barrier may be formed around the LED to encapsulate the encapsulating material 400 containing the phosphor in a position adjacent to the LED chip. Therefore, the phosphor may be uniformly distributed around the LED chip.

According to the present embodiment, the barrier 310 may be formed along an outer circumference of an electrode pad (not shown) to prevent the encapsulating material 400 containing the phosphor from being formed on the electrode pad of the LED chip 200. Also, the barrier 310 may cover the outer circumference of the LED chip 200 and the electrode pad to form the encapsulating material 400 containing the phosphor. Then, only the barrier 310 formed on the electrode pad may be removed, or the entire battier 310 may be removed.

Figure 6B:
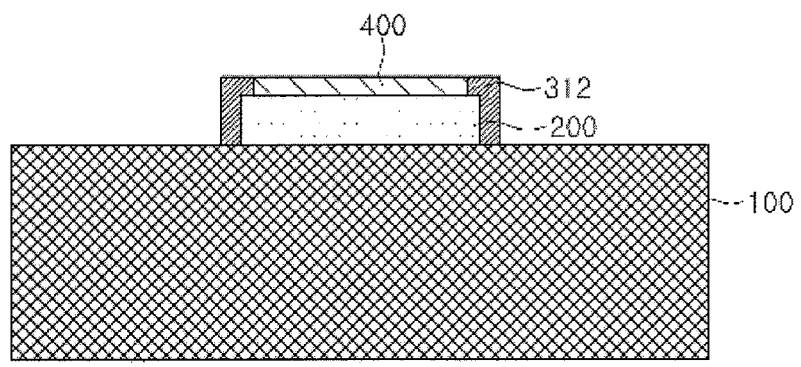
FIGS. 6B and 6C are other sectional views of the LED package according to the first embodiment.
Figure 6C:
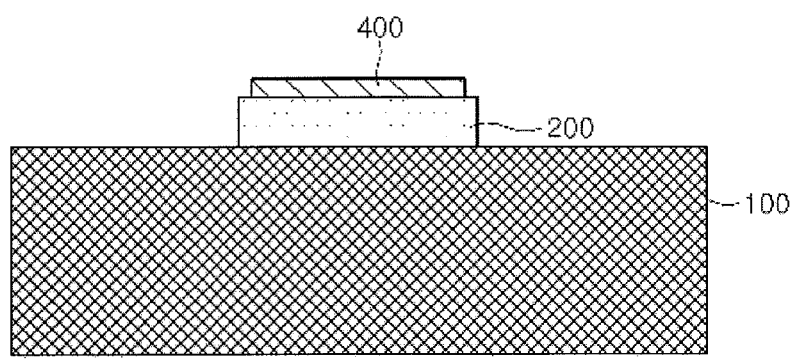

FIGS. 6B and 6C are other sectional views of the LED package according to the first embodiment.

As shown in FIG. 6B, a barrier 312 is disposed on a lateral surface of an LED chip 200 to serve as a passivation function.

Also, as shown in FIG. 6C, the process shown in FIG. 6A may be performed to remove the barrier 310.

Figure 6D:
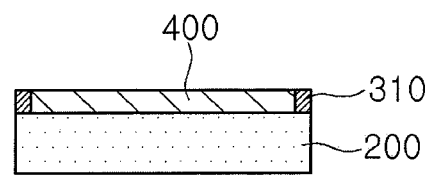
FIG. 6D is a sectional view of an LED according to an embodiment.

FIG. 6D is a sectional view of an LED according to an embodiment.

The present embodiment is not limited to the LED package. For example, as shown in FIG. 6D, a barrier 310 is disposed on an LED chip 200, and an encapsulating material 400 containing a phosphor may be disposed. Thereafter, a packaging process may be performed using the LED chip 200 including the encapsulating material 400 and the barrier 310.

Figure 7:
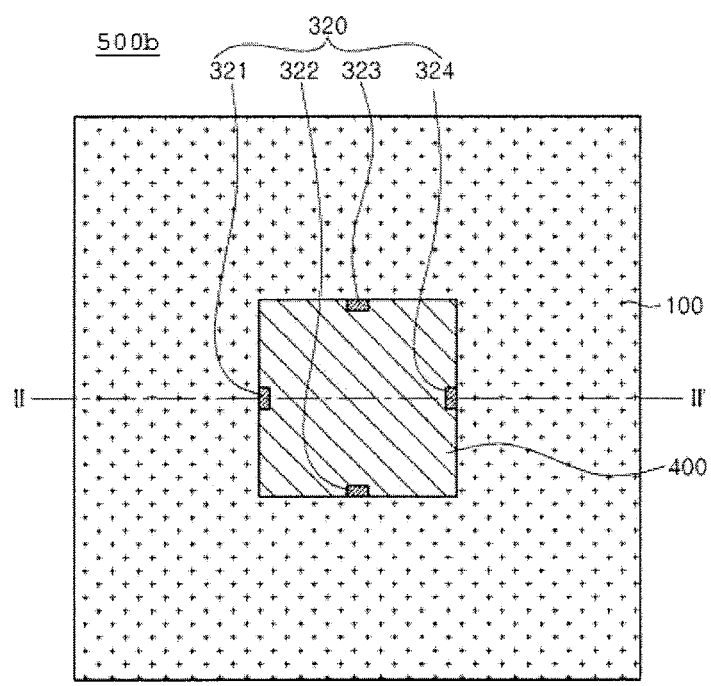
FIG. 7 is a plan view of an LED package according to a second embodiment.

FIG. 7 is a plan view of an LED package according to a second embodiment. A sectional view taken along line of FIG. 7 may be similar to that of FIG. 1.

The second embodiment may adopt technical characteristics of the first embodiment. Thus, characteristics of the second embodiment will be mainly described below.

In the second embodiment, barriers 320 may be disposed on an outer circumference of the LED chip in a state where they 320 are separated from each other. For example, the barrier 320 according to the second embodiment may include first to fourth barriers 321, 322, 323, and 324, which are separated from each other, but is not limited thereto. According to the second embodiment, since the barriers 320 separated from each other are disposed on the outer circumference of the LED chip 200, a light-shielding area may be minimized and an encapsulating material containing a phosphor may be encapsulated adjacent to the LED chip 200. Thus, the phosphor may be uniformly distributed around the LED chip 200.

Figure 8:
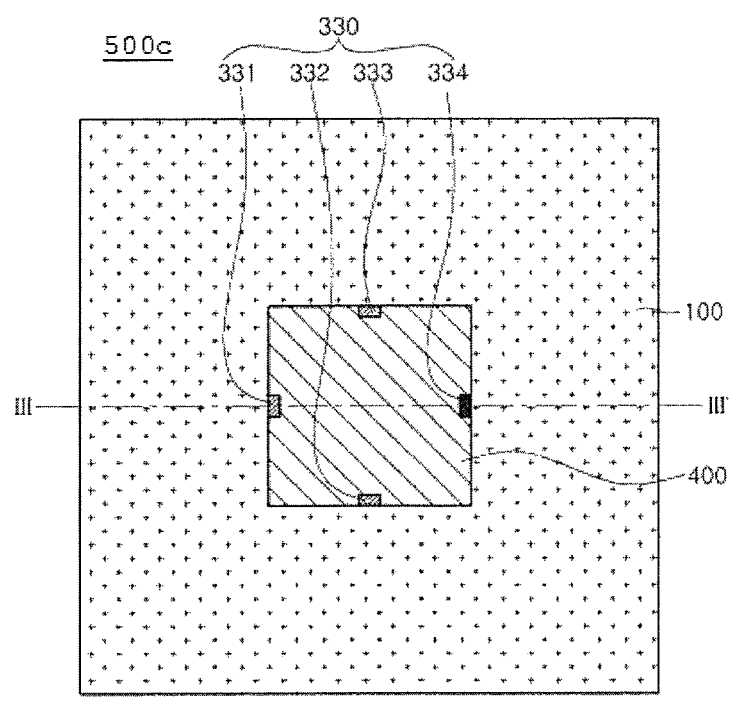
FIG. 8 is a plan view of an LED package according to a third embodiment.

FIG. 8 is a plan view of an LED package 500c according to a third embodiment. A sectional view taken along line III-III' of FIG. 8 may be similar to that of FIG. 1.

The third embodiment may adopt technical characteristics of the first and second embodiments. Thus, characteristics of the third embodiment will be mainly described below.

Barriers 330 according to the third embodiment may be disposed on an outer circumference of an LED chip 200 in a state where they 330 are separated from each other. For example, the barriers 330 according to the third embodiment may include first to fourth barriers 331, 332, 333, and 334, which are separated from each other, but is not limited thereto.

In the third embodiment, at least one of the first to fourth barriers 331, 332, 333, and 334, which are separated from each other, may be a pad. For example, the fourth barrier 334 may be the pad, but is not limited thereto. Here, the pad for the barrier may be formed in a LED chip process.

At least one of the first to fourth barriers 331, 332, 333, and 334, which are separated from each other, may be an actual pad, and the rest barriers may be dummy pads.

According to the third embodiment, since the barriers separated from each other are disposed on the outer circumference of the LED chip 200 using the pad, a light-shielding area may be minimized and an encapsulating material containing a phosphor may be encapsulated adjacent to the LED chip to uniformly distribute the phosphor around the LED chip.

Figure 9:
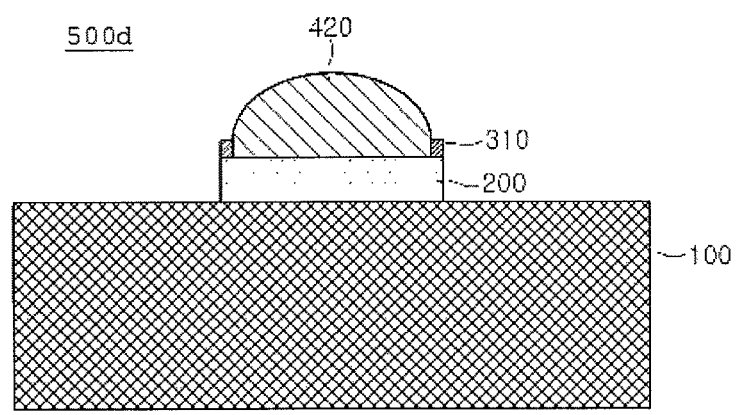
FIG. 9 is a sectional view of an LED package according to a fourth embodiment.

FIG. 9 is a sectional view of an LED package 500d according to a fourth embodiment.

The fourth embodiment may adopt technical characteristics of the first to third embodiments. Thus, characteristics of the fourth embodiment will be mainly described below.

In the fourth embodiment, an encapsulating material 420 may have a hemisphere shape. The encapsulating material 420 may be maintained in a uniform shape by a surface tension thereof to uniformly distribute a phosphor.

As a result, according to the present embodiment, since the encapsulating material is maintained on an LED chip 200 in the uniform shape by the surface tension thereof, the phosphor may be uniformly distributed in the encapsulating material. As a result, the distribution of the phosphor is uniform, and furthermore, the phosphor may be uniformly distributed with an area similar to that of the LED chip.

According to the present embodiment, a surface of the LED chip may have wettability to uniformly form the encapsulating material 420 on the LED chip 200 by the surface tension thereof.

For example, when a roughness (not shown) is disposed on a surface of the LED chip 200, the wettability of the encapsulating material 420 may be reduced to form the encapsulating material 420 having a hemisphere shape. Furthermore, light extraction efficiency may be improved.

According to the fourth embodiment, the encapsulating material 420 may have the hemisphere shape to improve the light extraction efficiency. Also, since a barrier 310 is disposed on an outer circumference of the LED chip 200, the encapsulating material 420 containing a phosphor may be distributed adjacent to the LED chip 200. Therefore, the phosphor may be uniformly distributed around the LED chip 200.

A plurality of LED packages 500 according to the embodiments may be arrayed on a substrate. Optical members such as a light guide plate, a prism sheet, a diffusion sheet, and a fluorescence sheet may be disposed on a path of light emitted from the LED package 500. The LED package 500, the substrate and the optical members may function as a backlight unit or lighting unit. For example, the lighting system may include a backlight unit, a lighting unit, an indicator unit, a lamp, a streetlamp, etc.

Figure 10:
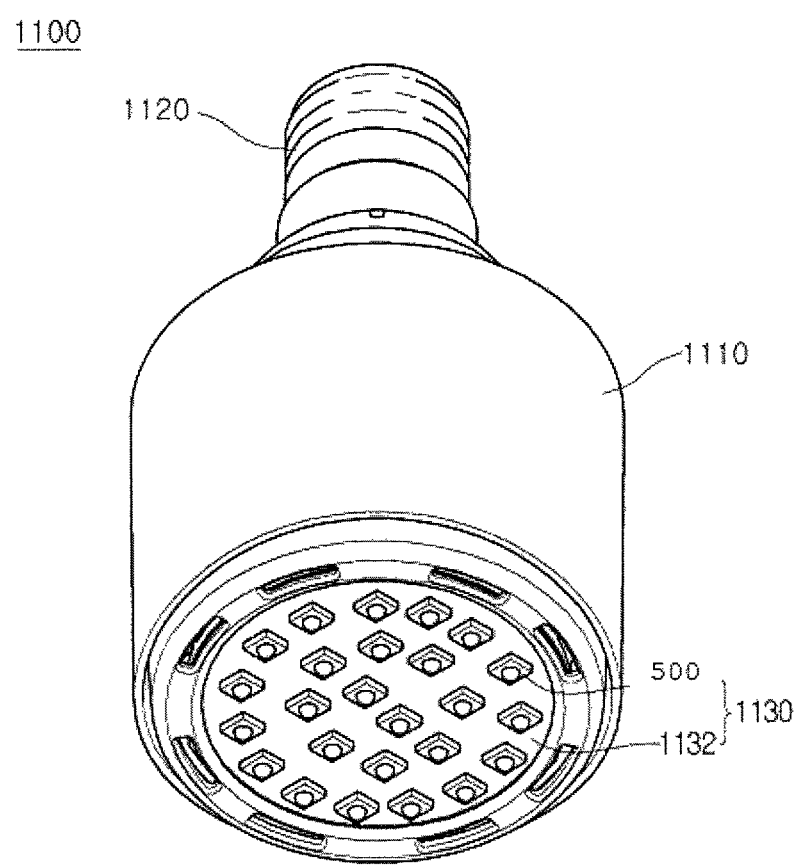
FIG. 10 is a perspective view of a lighting unit according to an embodiment.

FIG. 10 is a perspective view of a lighting unit 1100 according to an embodiment. The lighting unit 110 shown in FIG. 10 is an example of the lighting system, but is not limited thereto.

Referring to FIG. 10, the lighting unit 1100 may include a case body 1110, a light emitting module part 1130 installed in the case body 1110, and a connection terminal 1120 installed in the case body 1110 and receiving an electric power from an external power supply.

The case body 1110 may be formed of a material having a good heat dissipation characteristic, for example, a metal material or a resin material.

The light emitting module part 1130 may include a substrate 1132 and at least one an LED package 500 mounted on the substrate 1132.

The substrate 1132 may be a substrate in which circuit patterns are printed on an insulator. For example, the substrate 1132 may include a general printed circuit board (PCB), a metal core PCB, a flexible PCB, a ceramic PCB, etc.

Also, the substrate 1132 may be formed of a material capable of efficiently reflecting light or may have a surface having a color capable of efficiently reflecting light, for example, a white color, or a silver color.

The at least one LED package 500 may be mounted on the substrate 1132. Each of the LED packages 500 may include at least one light emitting device (LED) chip 200. The LED chip 200 may include colored light emitting diodes that respectively emit colored light such as red, green, blue or white light and a UV light emitting diode that emits ultraviolet rays.

The light emitting module part 1130 may have a combination of various LED packages 200 to obtain desired color tone and luminance. For example, the light emitting module part 1130 may have a combination of a white LED, a red LED, and a green LED to obtain a high color rendering index (CRI).

The connection terminal 1120 may be electrically connected to the light emitting module part 1130 to supply a power. As shown in FIG. 10, the connection terminal 1120 may be screwed and coupled to an external power source in a socket type, but is not limited thereto. For example, the connection terminal 1120 may be manufactured in a pin shape, and thus the connection terminal 1120 may be inserted into the external power source or connected to the external power source through a wire.

Figure 11:
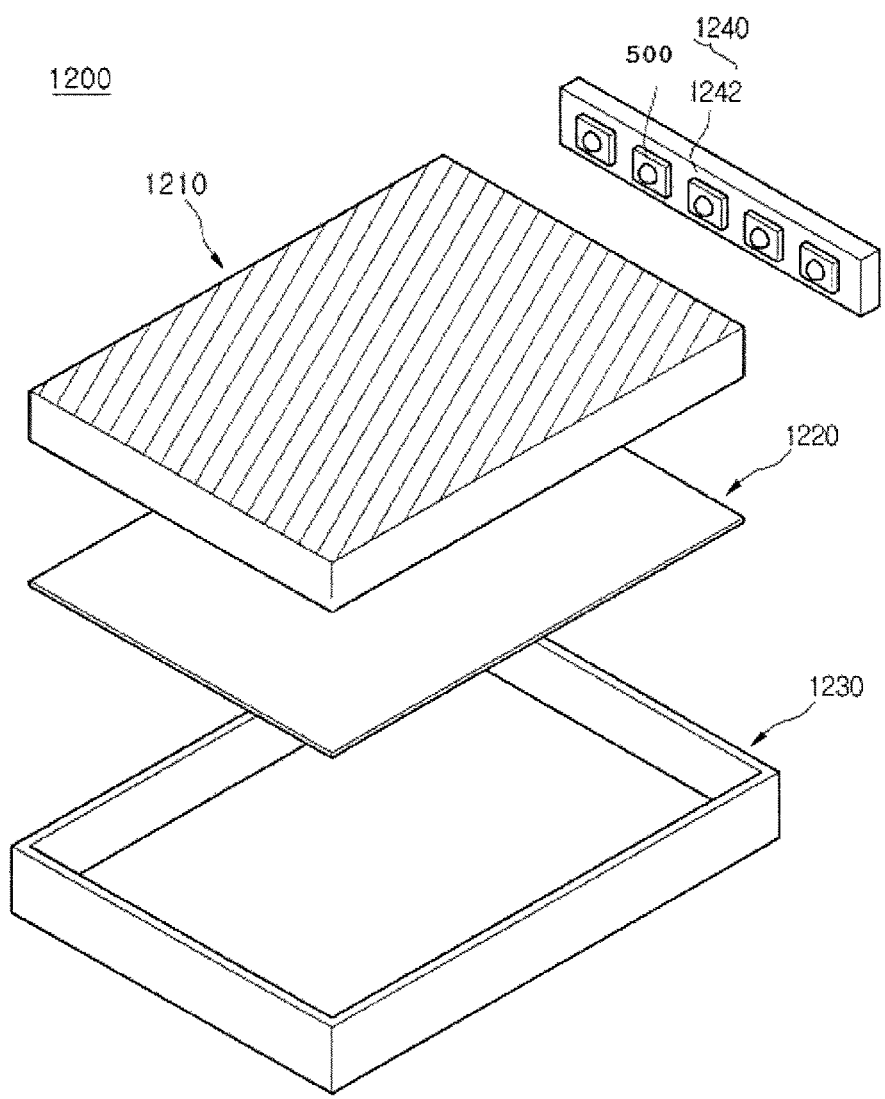
FIG. 11 is an exploded perspective view of a backlight unit according to an embodiment.

FIG. 11 is an exploded perspective view of a backlight unit 1200 according to an embodiment. The backlight unit 1200 shown in FIG. 11 is an example of lighting systems, and is not limited thereto.

The backlight unit 1200 according to the embodiment may include a light guide plate 1210, a light emitting module part 1240 supplying light to the light guide plate 1210, a reflective member 1220 below the light guide plate 1210, and a bottom cover 1230 receiving the light guide plate 1210, the light emitting module part 1240, and the reflective member 1220, but is not limited thereto.

The light guide plate 1210 diffuses light to produce planar light. The light guide plate 1210 may be formed of a transparent material. For example, the light guide plate 1210 may be formed of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module part 1240 provides light to at least one side surface of the light guide plate 1210, and finally acts as a light source of a display device in which the backlight unit is installed.

The light emitting module part 1240 may contact the light guide plate 1210, but is not limited thereto. Particularly, the light emitting module part 1240 may include a substrate 1242 and a plurality of LED packages 500 mounted on the substrate 1242. The substrate 1242 may contact the light guide plate 1210, but is not limited thereto.

The substrate 1242 may be a PCB including circuit patterns (not shown). The substrate 1242 may include a metal core PCB (MCPCB), a flexible PCB (FPCB), etc. as well as the general PCB, but is not limited thereto.

The plurality of LED packages 200 may be mounted on the substrate 1242 so that light emitting surfaces of the LED packages 200 are spaced a predetermined distance from the light guide plate 1210.

The reflective member 1220 may be disposed below the light guide plate 1210. The reflective member 1220 reflects light incident from a bottom surface of the light guide plate 1210 to allow the reflected light to be directed toward an upper direction, thereby improving brightness of the backlight unit. The reflective member 1220 may be formed of, for example, PET, PC, PVC resin, or the like, but is not limited thereto.

The bottom cover 1230 may receive the light guide plate 1210, the light emitting module part 1240, and the reflective member 1220. For this purpose, the bottom cover 1230 may be formed in a box shape with a top surface opened, but is not limited thereto.

The bottom cover 1230 may be formed of a metal material or a resin material. In addition, the bottom cover 1230 may be manufactured by using a process such as a press molding or an injection molding.

As described above, the lighting system according to the embodiments may include the LED package according to the embodiments to improve the reliability of the LED.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a light emitting diode chip;
   a plurality of barriers on a top surface of the light emitting diode chip, the barriers being separated from each other; and
   an encapsulant including a phosphor at an inner portion of the barriers on the light emitting diode chip,
   wherein a lateral width of the light emitting diode chip is substantially the same with a lateral width of the encapsulant including the phosphor,
   wherein the barriers comprise a dummy pad and a pad, and
   wherein the dummy pad is not electrically connected to the pad.

2. The light emitting device as claimed in claim 1, wherein the barriers include a thixotropic material.

3. The light emitting device as claimed in claim 1, wherein the barriers include at least two barriers separated from each other at an outer peripheral portion of the light emitting diode chip.

4. The light emitting device as claimed in claim 1, wherein the barriers are disposed on a substantially center portion of the outer peripheral portion of the light emitting diode chip.

5. The light emitting device as claimed in claim 1, wherein the barriers are formed on both a side surface and a top surface of an outer peripheral portion of the light emitting diode chip.

6. The light emitting device as claimed in claim 1, wherein the barriers include an Ag epoxy.

7. A light emitting device comprising:
   a light emitting diode chip;
   a barrier on a top surface of the light emitting diode chip; and
   an encapsulant including a phosphor at an inner portion of the barrier on the light emitting diode chip,
   wherein a lateral width of the light emitting diode chip is substantially the same with a lateral width of the encapsulant including the phosphor, and
   wherein the barrier comprises four barriers separated from each other at an outer peripheral portion of the light emitting diode chip.

8. The light emitting device as claimed in claim 7, wherein at least one of the barriers comprises a dummy pad, and at least one of the barriers comprises a pad, and
   wherein the dummy pad is not electrically connected to the pad.

9. The light emitting device as claimed in claim 1, wherein the barriers are formed on a top surface of an outer peripheral portion of the light emitting diode chip.

10. The light emitting device as claimed in claim 1, wherein the barriers are connected to an outer peripheral portion of the light emitting diode chip.

11. The light emitting device as claimed in claim 1, wherein the barriers include a conductive material or a non-conductive material.

12. The light emitting device as claimed in claim 1, wherein the encapsulant has a flat top surface.

13. The light emitting device as claimed in claim 12, wherein a height of the flat top surface of the encapsulant is substantially equal to a height of a flat top of the barriers.

14. The light emitting device as claimed in claim 1, wherein the encapsulant comprises a flat top surface and the flat top surface of the encapsulant comprises a roughness.

15. The light emitting device as claimed in claim 7, wherein a height of a top surface of the four barriers is equal to a height of a top most flat top surface of the encapsulant.

16. A light emitting device comprising:
a light emitting diode chip;
at least two barriers on the light emitting diode chip, the at least two barriers separated from each other at an outer peripheral portion of the light emitting diode chip; and
an encapsulant including a phosphor at an inner portion of the barrier on the light emitting diode chip,
wherein the encapsulant comprises a flat top surface,
wherein the flat top surface is substantially the same as a flat top of the barriers, and
wherein one of the barriers is a dummy pad, and the other one of the barriers is a pad, and wherein the dummy pad is not electrically connected to the pad.

17. The light emitting device as claimed in claim 16, wherein the at least two barriers comprises four barriers separated from each other at the outer peripheral portion of the light emitting diode chip.

18. The light emitting device as claimed in claim 16, wherein the at least two barriers are disposed on a substantially center portion of the outer peripheral portion of the light emitting diode chip.

19. The light emitting device as claimed in claim 16, wherein the at least two barriers are formed on both a side surface and a top surface of an outer peripheral portion of the light emitting diode chip.

\* \* \* \* \*